(12) United States Patent
Johansen et al.

(10) Patent No.: US 10,887,978 B2
(45) Date of Patent: Jan. 5, 2021

(54) EXPANDING THERMAL DEVICE AND SYSTEM FOR EFFECTING HEAT TRANSFER WITHIN ELECTRONICS ASSEMBLIES

(71) Applicant: Raytheon Company, Waltham, MA (US)

(72) Inventors: Brian W. Johansen, Mckinney, TX (US); Justin Kasemodel, McKinney, TX (US); James M. Elliott, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/399,754

(22) Filed: Apr. 30, 2019

(65) Prior Publication Data

US 2019/0261502 A1 Aug. 22, 2019

Related U.S. Application Data

(62) Division of application No. 15/158,399, filed on May 18, 2016, now Pat. No. 10,292,255.

(51) Int. Cl.
*H05K 7/20* (2006.01)
*H05K 1/02* (2006.01)
(Continued)

(52) U.S. Cl.
CPC ....... *H05K 1/0204* (2013.01); *H01L 23/4275* (2013.01); *H01L 23/4338* (2013.01); *H05K 1/181* (2013.01); *H05K 3/34* (2013.01); *H05K 7/2049* (2013.01); *H05K 2201/10227* (2013.01); *H05K 2201/10507* (2013.01)

(58) Field of Classification Search
None
See application file for complete search history.

(56) References Cited

U.S. PATENT DOCUMENTS

| 4,069,498 A | 1/1978 | Joshi |
| 4,189,697 A | 2/1980 | Hara |

(Continued)

FOREIGN PATENT DOCUMENTS

JP H01-166544 A 6/1989

OTHER PUBLICATIONS

International Search Report for International Application No. PCT/US2017/020820 dated Jun. 1, 2017, 15 pages.

*Primary Examiner* — Courtney L Smith

(57) ABSTRACT

Heat transfer devices and systems for thermally coupling electrical components to a heatsink can comprise one or more all-metal heat transfer device(s) thermally coupling at least one electrical component to a heatsink. A heat transfer device can comprise a metal cup attached to a metal heatsink, and a metal piston and a compliant device disposed in the cup. The piston is forcible to a secured first position, upon reflowing solder, while compressing the compliant device. Upon reflowing solder again, the compliant device causes the piston to bias and attach to the electrical component to provide an all-metal thermal path and absorb assembly tolerances to avoid using thermal gap fillers. A method is provided for thermally coupling a heatsink to a plurality of electrical components via a plurality of all-metal, expandable heat transfer devices.

12 Claims, 7 Drawing Sheets

(51) Int. Cl.
*H01L 23/427* (2006.01)
*H01L 23/433* (2006.01)
*H05K 1/18* (2006.01)
*H05K 3/34* (2006.01)

(56) References Cited

U.S. PATENT DOCUMENTS

| | | | |
|---|---|---|---|
| 4,193,445 A * | 3/1980 | Chu | H01L 23/4338 165/185 |
| 4,210,893 A | 7/1980 | Hara | |
| 4,385,310 A | 5/1983 | Houston | |
| 4,920,574 A * | 4/1990 | Yamamoto | H01L 23/4332 165/80.4 |
| 5,660,917 A | 8/1997 | Fujimori et al. | |
| 5,736,918 A | 4/1998 | Douglas | |
| 6,214,647 B1 | 4/2001 | Di Giacomo et al. | |
| 6,248,422 B1 | 6/2001 | Robbie et al. | |
| 6,324,060 B1 | 11/2001 | Hsu | |
| 6,385,044 B1 | 5/2002 | Colbert et al. | |
| 6,504,292 B1 | 1/2003 | Choi et al. | |
| 6,642,833 B2 | 11/2003 | Ranjan et al. | |
| 6,896,045 B2 | 5/2005 | Panek | |
| 6,947,295 B2 | 9/2005 | Hsieh | |
| 6,999,317 B2 * | 2/2006 | Chengalva | H01L 23/3677 165/185 |
| 7,379,301 B2 * | 5/2008 | Liu | H01L 23/473 165/104.31 |
| 7,405,940 B1 * | 7/2008 | Audet | H01L 23/4338 174/250 |
| 7,535,099 B2 | 5/2009 | Suh et al. | |
| 7,539,016 B2 | 5/2009 | Sauciuc et al. | |
| 8,405,996 B2 | 3/2013 | Shaddock et al. | |
| 9,443,689 B2 | 9/2016 | Wosgien et al. | |
| 2002/0064026 A1 | 5/2002 | Messina | |
| 2003/0071246 A1 | 4/2003 | Grigorov et al. | |
| 2003/0117770 A1 | 6/2003 | Montgomery et al. | |
| 2004/0261987 A1 | 12/2004 | Zhang et al. | |
| 2005/0006754 A1 | 1/2005 | Arik et al. | |
| 2006/0234056 A1 | 10/2006 | Huang et al. | |
| 2008/0057279 A1 | 3/2008 | Fang | |
| 2008/0117015 A1 | 5/2008 | Leach | |
| 2009/0045432 A1 | 2/2009 | Kim et al. | |
| 2009/0151907 A1 | 6/2009 | Karidis et al. | |
| 2010/0252713 A1 | 10/2010 | Saito | |
| 2012/0326294 A1 | 12/2012 | Sikka et al. | |
| 2013/0181040 A1 * | 7/2013 | Watanabe | H01L 21/4814 228/211 |
| 2013/0200984 A1 | 8/2013 | Matthiesen et al. | |
| 2013/0206363 A1 * | 8/2013 | Kirk | F28F 7/00 165/84 |
| 2014/0027898 A1 * | 1/2014 | Sikka | H01L 23/10 257/704 |
| 2014/0116613 A1 | 5/2014 | Han | |

\* cited by examiner

EXPANDING THERMAL DEVICE AND SYSTEM FOR EFFECTING HEAT TRANSFER WITHIN ELECTRONICS ASSEMBLIES

RELATED APPLICATIONS

This is a divisional application of U.S. application Ser. No. 15/158,399, filed May 18, 2016, entitled "Expanding Thermal Device and System for Effecting Heat Transfer within Electronics Assemblies" which is incorporated by reference in its entirety herein.

BACKGROUND

Often when assembling electrical circuit boards, thermal gap fillers are required in order to absorb assembly tolerances while still maintaining a thermal path from the circuit board to a heatsink for normal operation of the board and its components. During assembly, a large surface area is typically "gap filled" between the electrical chips and a heatsink in order to transfer heat from the chips. However, gap fillers have a low thermal conductivity as compared to metal heat transfer devices, for example. Moreover, the gap filler process can be time consuming and costly. In addition, the area of the gap fillers on a circuit board often become the area of the highest temperatures during operation of the chips.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1A:
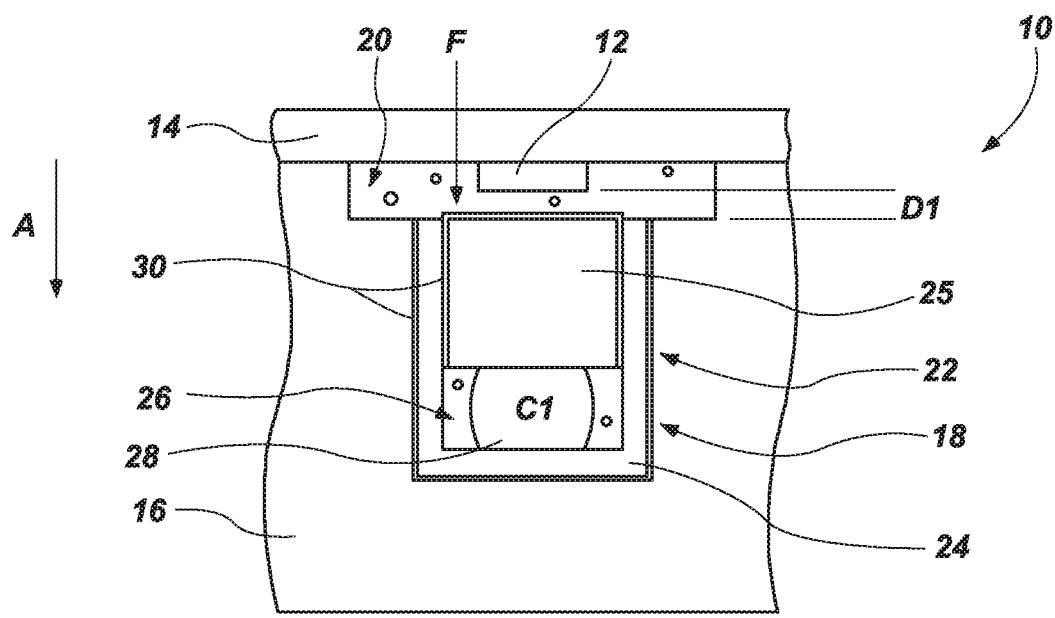
FIG. 1A is a cross-sectional view of a system for transferring heat from an electrical component to a heatsink, in accordance with an example of the present invention.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness can in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" can be either abutting or connected. Such elements can also be near or close to each other without necessarily contacting each other. The exact degree of proximity can in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A system for effecting heat transfer within an electronics device by thermally coupling at least one electrical component to a heatsink and absorbing assembly tolerances, in accordance with one example, is disclosed. The system can comprise at least one electrical component as part of an electronics assembly and a heatsink operative to transfer heat from the electronics assembly. The heatsink can have a counterbore defining a cavity, or the heatsink may have a planar heat transfer surface. An expanding thermal gap fill heat transfer device can be positioned in the counterbore (or biased against the heat transfer surface of the heatsink) and thermally attachable to the at least one electrical component. The system provides a system of transferring heat from a circuit board or other electronics assembly that accounts for assembly tolerances while providing a sufficient thermal path for the heat transfer.

In one example, an expanding thermal gap fill heat transfer device can comprise a piston moveable within the cavity and a flowable material (e.g., solder) disposed about the piston and/or the cavity. The flowable material can comprise a lower melting point than the piston and the heatsink, and the flowable material can be transitional between a solid and liquid state upon the application of energy, such as heat. The heat transfer device can further comprise a compliant device biasing the piston in a direction towards the at least one electrical component, the compliant device being deformable, and thus movable from a compressed state to an expanded state to facilitate movement of the piston. In this example, the piston can be held in a first position by the flowable material (being in the solid state), the compliant device being in the compressed state in this first position of the piston. Upon reflowing the flowable material, the piston can move or be caused to move into a second position to be in thermal contact with the electrical component(s), the compliant device being in an expanded state in this second position of the piston. The piston can be moved or caused to move by the compliant device transitioning from its compressed state to its expanded state. In one example, the interfaces between the above-discussed components are all metal. Thus, the heat transfer device, positioned in the counterbore (or against a surface of the heatsink) and in the expanded state, can provide all-metal thermal conductive path between the electrical component(s) and the heatsink. The heat transfer device can further absorb assembly tolerances of the electrical components, such that a typical gap filler or other filler is not needed.

In one example, the heat transfer device can comprise a cup disposed within the counterbore of the heatsink, or the cup may be biased or otherwise coupled to a surface of the heatsink. The cup can further define a cavity, and can be operative to receive the piston and to facilitate its movement therein. The piston, cup, heatsink, and flowable material can each comprise a type of metal, such that an all-metal thermally conductive path is created from the electrical component(s), through the heat transfer device, and out through the heatsink.

A system for thermally coupling at least one electrical component to a heatsink and absorbing assembly tolerances, in accordance with one example, can comprise an electronics assembly having a substrate (e.g., a Printed Wire Board or PWB) having a plurality of electrical components attached thereto. A heatsink can have a plurality of counterbores, each defining a cavity. A plurality of heat transfer devices can be coupled to or otherwise operative with the heatsink. For instance, each heat transfer device can be positioned in a respective counterbore of the heatsink, or the cup may be biased or otherwise coupled to a surface of the heatsink. Each heat transfer device can comprise a variety of components and features described herein.

The present disclosure further provides a method for effecting heat transfer within an electronics device by providing an expanding thermal gap fill heat transfer device that thermally couples a heatsink to at least one electrical component and absorbs assembly tolerances, in accordance with one example. The method can comprise providing a heatsink having a counterbore defining a cavity, or providing a heat sink having a heat transfer surface. The method can also comprise disposing a compliant device and a piston within the counterbore, and providing a flowable material to be in contact with the piston and the heatsink. The method can further comprise applying a force to displace the piston and cause the compliant device to enter a compressed state. The method can still further comprise reflowing the flowable material in a first sequence to secure the piston in a first position. The method can still further comprise removing the applied force and reflowing the flowable material in a second sequence to secure the piston in a second position to be in thermal contact with the electrical component(s).

The above method steps can be repeated to create a plurality of separate heat transfer points along the electronics assembly and heatsink, such that a plurality of pistons facilitate heat transfer from a plurality of electrical components through the heatsink. The method can comprise repeating some or all of the method steps above in multiple sequences, and positioning a plurality of electrical components adjacent a plurality of compressed heat transfer devices. The method can comprise absorbing assembly tolerances when the plurality of pistons is in contact with the plurality of electrical components upon reflowing the heat transfer devices to be in their expanded states.

Figure 1B:
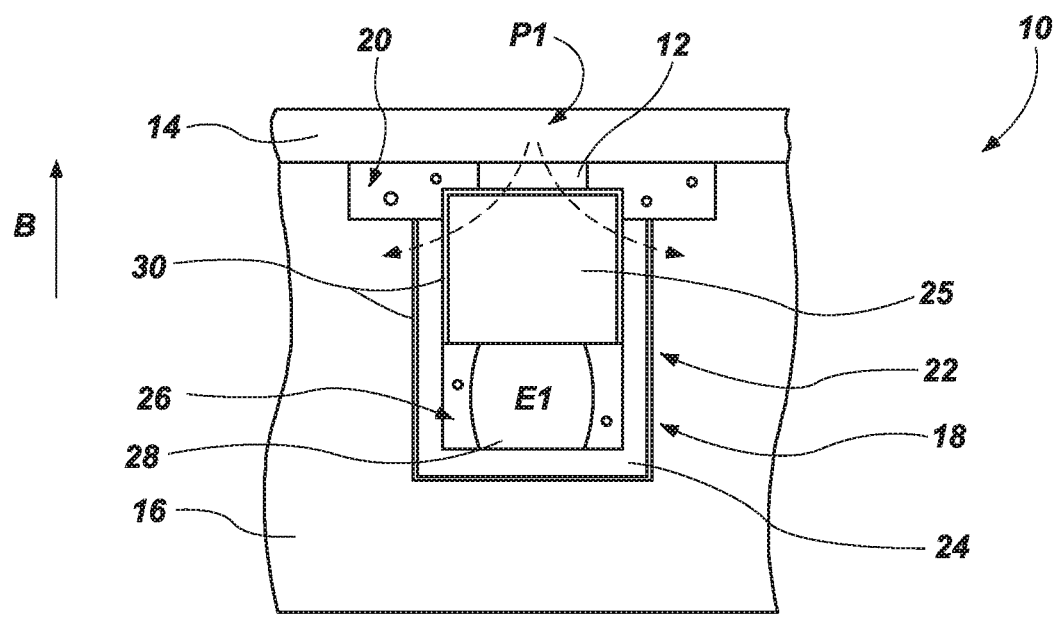
FIG. 1B is a cross-sectional view of the system of FIG. 1A in an expanded state, in accordance with an example of the present invention.
Figure 2:
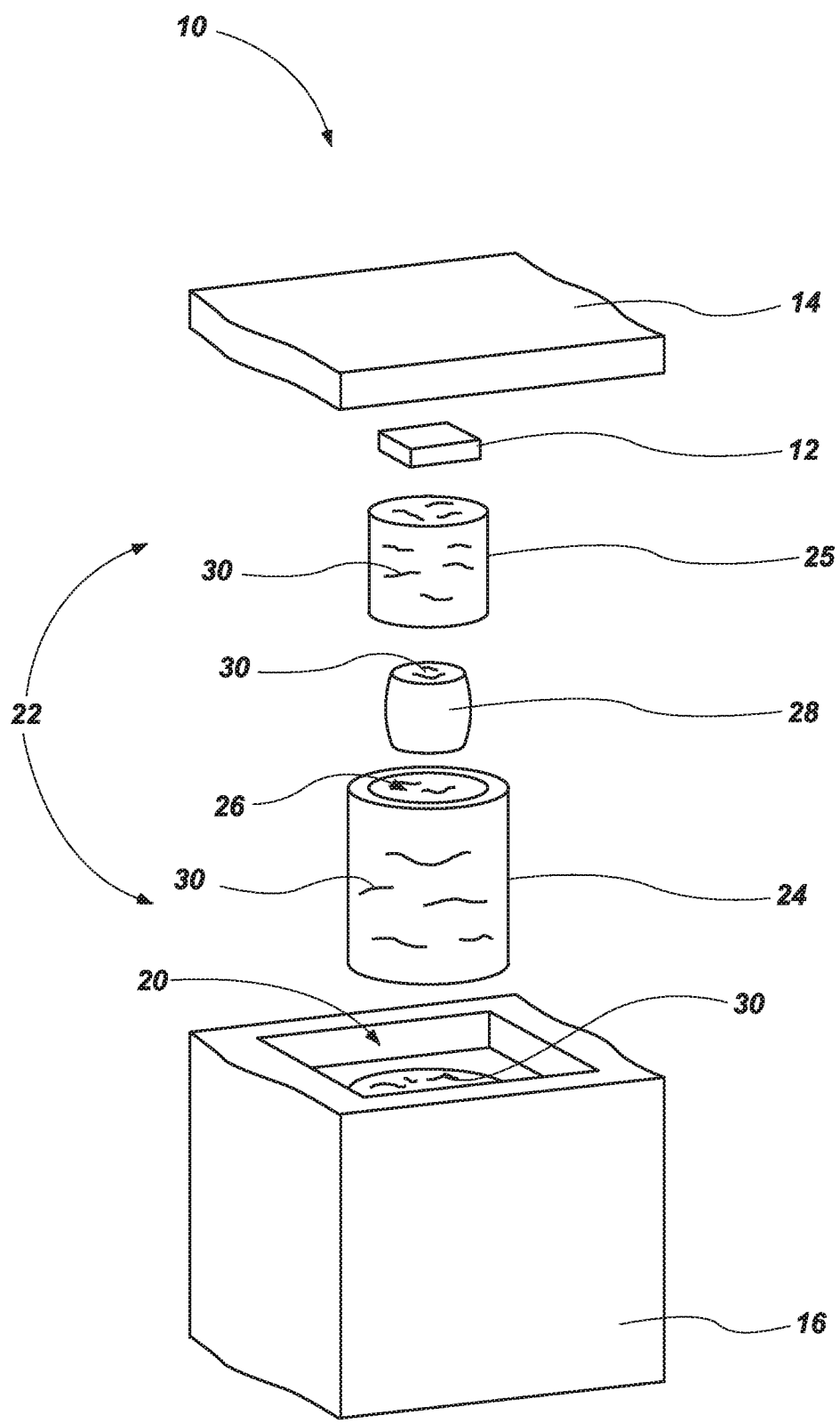
FIG. 2 is an exploded view of FIGS. 1A and/or 1B, in accordance with an example of the present invention.

FIGS. 1A-2 show an example system 10 for thermally coupling an electrical component to a heatsink (see FIG. 2 for an exploded view). The system 10 can comprise an electrical component 12 as part of an electronics assembly 14. The electrical component 12 can be positioned about or in close proximity to a heatsink 16 operative to transfer heat from the electronic component 12 about a path (e.g., path P1). The heatsink 16 can have a counterbore 18 defining a cavity 20 (throughout this application, cavities and voids will be shown having "air bubbles" to avoid illustrating numerous cross sectional lines on all the components in the cross-sectional views). The system can comprise a heat transfer device 22 positionable in the counterbore 18. In some aspects, the system 10 can further comprise a cup 24 disposed within the counterbore 18 of the heatsink 16, the cup defining a cavity (e.g., see cavity 26 in FIG. 2). The cup 24 can be operative to receive a piston 25 to facilitate its movement therein (see arrows A and B) during reflowing stages or processes.

A compliant device 28, such as an elastomeric disk or cylinder, can be positioned between the cup 24 and the piston 25. The compliant device 28 can be caused to move to and from a compressed state C1 (FIG. 1A) and to an expanded state X1 (FIG. 1B) to facilitate movement of the piston 25. A flowable material 30 can be disposed about the piston 25 (and can be disposed on other surfaces of the various components of the system, such as between and/or on the cup 24 or the counterbore 18 (e.g., see FIG. 2)). The flowable material 30, such as solder, can comprise a lower melting point than the piston 25 and the heatsink 16 in order to properly reflow the flowable material 30 without damaging the piston 25, the heatsink 16 or any of the electronics of the system. In one aspect, the piston 25 can be made of copper, and the heatsink 16 can be made of aluminum. However, those skilled in the art will recognize that other materials can be used and that are suitable to perform as intended. The flowable material 30 discussed herein can comprise other materials, such as lead, tin, silver, and the like, as long as its melting point temperature is less than the surrounding components.

The flowable material 30 can be configured to be capable of transitioning between a solid and liquid state upon the application of energy, such as heat (e.g., reflowing solder). The flowable material 30 can assist with securing the piston 25 in a desired position while in the solid state and moving the piston 25 while in the liquid state, as further discussed below. For example, in FIG. 1A the piston 25 is shown as being held in a first position by the flowable material 30 being in the solid state with the compliant device 28 in its compressed state C1, wherein in this state the compliant device 28 applies a biasing force against or to the piston 25 in an expansion direction of the compliant device 28. This state can be achieved by applying a sufficient force F on the piston downward toward the compliant device 28 to compress the compliant device 28 while reflowing the flowable material (preferable before the electronic component 12 is positioned adjacent the heat transfer device, which method will be discussed further below), such that the piston 25 is held in place in this first position via the flowable material 30 upon reaching its solidified state. With the electronic component 12 in position adjacent the heat transfer device 22, the flowable material 30 can again be reflowed, such that the compliant device 28 is caused to expand, thereby moving the piston 25 into a second position (FIG. 1B) to be in thermal contact with the electrical component 12. Consequently, the compliant device 28 would then be in its expanded state E1. Upon such movement of the piston 25, a tolerance distance D1 between the piston 25 and the electrical component 12 can be accounted for as the piston 25 moves from its first position (FIG. 1A) to its second position (FIG. 1B).

It is not uncommon for the electrical components of the electronics assembly to comprise differing tolerances, such as between the electrical component and the heatsink. One particular advantage of the present invention is the ability to account for and operate with such differing tolerances. Indeed, the amount of expansion of the compliant device, and coincidently the distance that the piston is caused or permitted to move or travel in order to come into thermal contact with an electrical component, may be different from one heat transfer device to another and from electrical component to another within the same electronics assembly. Stated differently, a plurality of heat transfer devices can be configured to operate independent of one another and can be caused to make thermal contact with a plurality of electrical components irrespective of differing tolerances between the electrical components and the heatsink.

In FIG. 1B the compliant device 28 is shown in its expanded state E1 and the flowable material 30 is in its solid state as mechanically coupled to the electronics component and the heatsink. It will be understood that "expanded" can mean that the compliant device 28 is in at least a partially expanded state (transferring at least some or all of its potential energy to the piston). Indeed, "expanded" may mean the compliant device is partially expanded when the piston makes its anticipated thermal connection with the electrical component, or it may mean that the compliant device is fully expanded when the piston makes its anticipated thermal connection with the electrical component. In any event, this can be achieved during a reflowing process by allowing the flowable material to cool after the compliant device 28 has moved the piston 25 into its second position. In this position, the piston 25 can be secured to the electrical component 12, the cup 24, and the heatsink 16. In an example where the piston, cup, heatsink, and flowable material are each comprised of a type of metal, an all-metal thermal conductive path P1 can be created between the electrical component 12 and the heatsink 16. As such, gap fillers for use in electronics assemblies can be eliminated. Therefore, an advantage of this arrangement is the creation of a gap free solid metal interface independent of mechanical assembly tolerances, and that the thermal conductivity of the interface can be increased by several orders of magnitude. For example, in the case of solder being used as the flowable material, the metal interface has the thermal conductivity of solder (30 W/m-K) that is an order of magnitude higher than that of a gap filler (2.8 W/m-K). Similar results can be achieved with other types of flowable materials.

Figure 3:
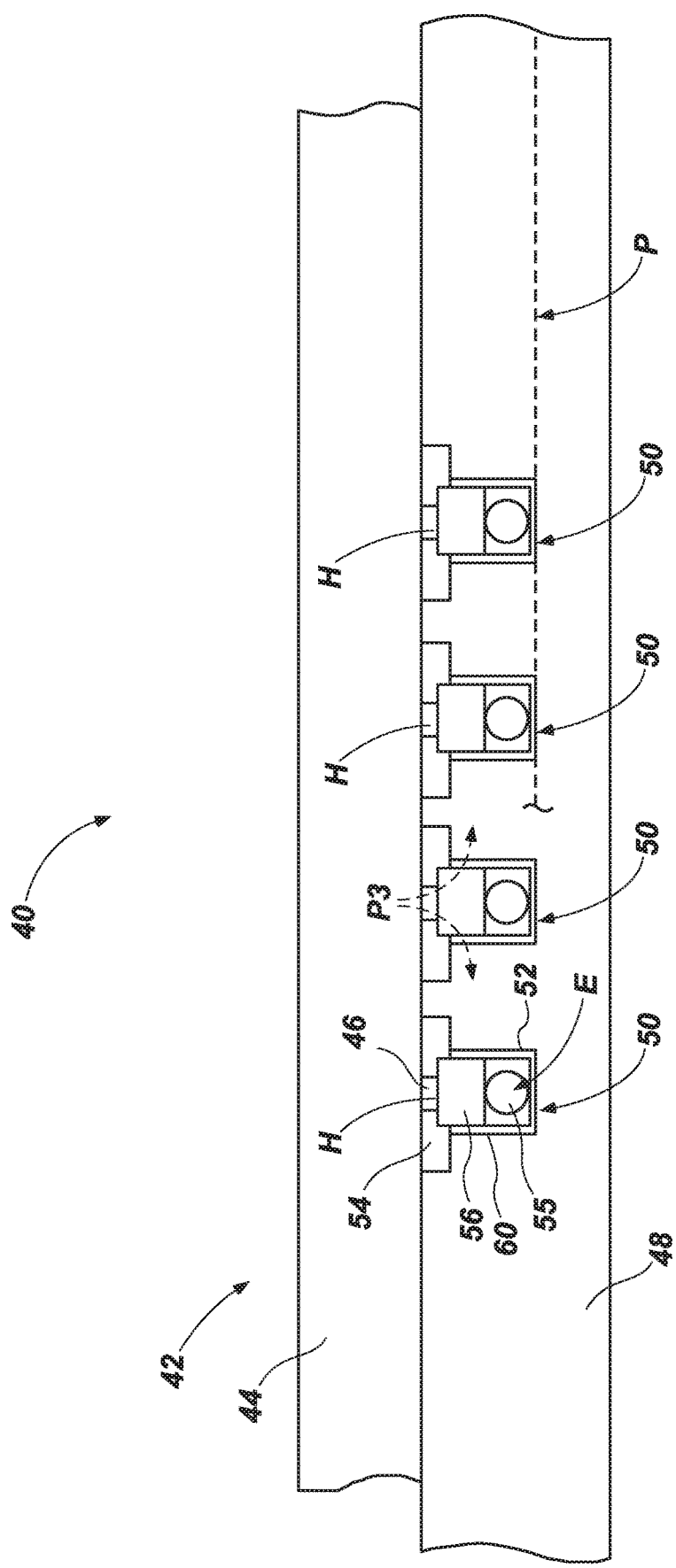
FIG. 3 is a cross-sectional view of an electronics system for transferring heat from an electrical assembly to a heatsink, in accordance with an example of the present invention.

FIG. 2 illustrates an exploded view of the system 10 of FIGS. 1A and 1B, in accordance with one example. As shown, the electronics assembly 14 comprises an attached electrical component 12. An example electronics assembly can comprise a Printed Wiring Board (PWB) having a plurality of electrical chips attached thereto that require heat transfer for normal operation (such as shown in FIG. 3). The heatsink 16 can be a water-cooled or an air-cooled aluminum coldplate; however, other known heatsinks and/or heat transfer systems could be used.

In one aspect, the heat transfer devices discussed herein can be utilized at specific or discrete areas or locations of an electronics system or assembly and heatsink arrangement. As such, it is contemplated that an electronics system or assembly and heatsink arrangement can comprise one or a plurality of such heat transfer devices. Of course, the electronics assembly and heatsink arrangement can be much larger than shown (such as a relatively large PWB board with dozens or hundreds of chips attached thereto). Of course, the heatsink in such electronics assembly could be much larger than shown in the Figures. As such, in another aspect, a plurality of heat transfer devices as discussed herein could be used at various locations.

As represented by the wavy lines on FIG. 2, the flowable material 30 can be disposed on some or all of the surfaces of the counterbore 18, the cup 24, the piston 25, and/or the electrical component 12 (whether in liquid or solid state depending on the state of the heat transfer device and processes). The flowable material 30 can be derived from solder sheets cut to a cylindrical shape to be disposed around the piston 25, for example. A solder disk can be positioned between the piston 25 and the compliant device 28 to secure the compliant device 28 to the piston 25 to assist with smooth translation of the piston 25 during the reflow processes.

FIG. 3 shows a cross-sectional view of a system 40 comprising an electronics assembly 42 having a substrate 44 having attached a plurality of electrical components 46, according to one example. The system 40 is shown in an expanded state with the pistons in contact with the electrical components 46. As shown, the system 40 can comprise a heatsink 48 operative to transfer heat from the electrical components 46. The system 40 can comprise a plurality of heat transfer devices 50 coupled to or otherwise operative with the heatsink 48. The heat transfer devices 50 can each be operative within a respective counterbore 52. Alternatively, the heat transfer devices 50 can be biased to or otherwise coupled to a planar surface or other surface of the heatsink 48, as illustrated by dashed line P where the two right-side devices 50 are coupled to a surface P of the heatsink 48. In the example of FIG. 3, the heat transfer devices 50 are shown as being similar to the expanded devices shown in FIG. 1B. However, any combination of components of the heat transfer devices 50 discussed herein can be used with the example system of FIG. 3.

In one example of manufacturing the system 40, a method of thermally coupling the heatsink 48 to one (of possibly many) electrical components 46 comprises providing the heatsink 48 having a counterbore 52 defining a cavity 54 (e.g., FIG. 2). The method can comprise disposing a compliant device 55 and a piston 56 within the counterbore 52. The method can comprise providing a flowable material (see e.g., FIG. 1B) disposed about the piston 56 and/or the heatsink 48. The method can comprise applying a force (e.g., force F in FIG. 1A) to displace the piston 56 and cause the compliant device 55 to enter a compressed state (e.g., FIG. 1A). The method can comprise reflowing the flowable material (not shown here) in a first sequence to secure the piston 56 in a first position (e.g., FIGS. 1A, 4, 5, and 6A). Reflowing can be achieved by applying energy, such as heat, to the flowable material sufficient to place it in a liquid state, and then allowing it to cool to a solid state, thereby securing the piston in the first position, for example. The method can comprise removing the applied force from the piston 56 (or alternatively inserting a pre-loaded or pre-compressed heat transfer device into a counterbore) and reflowing the flowable material in a second sequence, thereby allowing the compliant device 55 to release its potential energy and move the piston 56 against the electrical device 46. The flowable material can be allowed to cool and solidify, thereby securing the piston 56, in a second position relative to the heatsink 48 and the electrical component 46. The piston 56, therefore, can be caused to be in thermal contact with the electrical component 46 and the heatsink 48, thereby providing a thermal path P3 (dashed lines), drawing heat from the electrical component 46, through the heat transfer device 50 and to the heatsink 48. In some examples, the method can comprise providing a metal cup 60 within the counterbore 52 of the heatsink 48 (see FIG. 4 for an example heat transfer device without a cup).

Alternatively, a heat transfer device can be manufactured (e.g., pre-loaded or pre-compressed) and then later inserted into a counter bore of a heatsink for subsequent expansion and thermal interaction with an electrical component of an electronics assembly. For instance, at a separate location the compliant device 55 and the piston 56 can be inserted into the cup 60, whereby solder is disposed about the components. A force can then be applied against the piston 56 to compress the compliant device 55, and the solder reflowed in a first sequence and then allowed to cool, thereby placing the piston 56 of the heat transfer device 50 in a pre-loaded or pre-compressed first position. The heat transfer device can then be later inserted into or disposed within a counterbore of the heatsink.

In some examples, the method can further comprise concurrently (or sequentially) inserting a plurality of heat transfer devices into a plurality of respective counterbores (or elsewhere on a heatsink). This can be achieved as discussed above, either by a plurality of individual heat transfer device components inserted into the counterbores, or by a plurality of compressed heat transfer devices loaded into the counterbores in the compressed state.

The method can comprise positioning a plurality of electrical components 46 adjacent the plurality of heat transfer devices 50 while the compliant devices 55 are in their compressed state. The electronics assembly 42 can be made to be operative with the heatsink at this time, or later. The method can comprise reflowing the flowable material in a second sequence, thereby allowing the compliant devices 55 to release their potential energy and move their respective pistons 56 against their respective electrical components 46. The flowable material is allowed to cool and solidify, thereby securing the pistons 56 to the cup 60, the heatsink 48, and the electrical components 46. In this position, the pistons 56, therefore, can be caused to be in thermal contact with their respective electrical components 46 and the heatsink 48.

The devices, systems and methods described herein can provide a plurality of separate metal-to-metal heat transfer points or areas H between the heat transfer devices and the electrical components. These heat transfer points H can each include a substantially smaller area or foot-print of heat transfer surface areas as compared to existing systems that use thermal gap fillers, which can consume much or all of the available surface area of the PWB.

Moreover, the devices, systems and methods described herein can function to absorb or account for assembly tolerances of the plurality of mounted electrical components. To this end, when a plurality of chips, for instance, are manufactured on a PWB, there exists a variety of tolerance differences in the chips relative to other chips, the PWB and/or the heatsink (e.g., tolerance gaps and differences in the x, y, and/or z directions). Therefore, one advantage of the present technology discussed herein is the ability of the heat transfer devices to account for inconsistent or different tolerances. For instance, when reflowing the heat transfer devices 50 in the second sequence, a particular piston 56 can come to rest in its second state at a different height and/or position relative to other pistons of other heat transfer devices due to the tolerance differences in the electronics assembly. As such, the method can further comprise configuring the plurality of heat transfer devices to operate independent of one another, such that the plurality of heat transfer devices make thermal contact with the plurality of electrical components on the substrate irrespective of differing tolerances between the electrical components and the heatsink.

Figure 4:
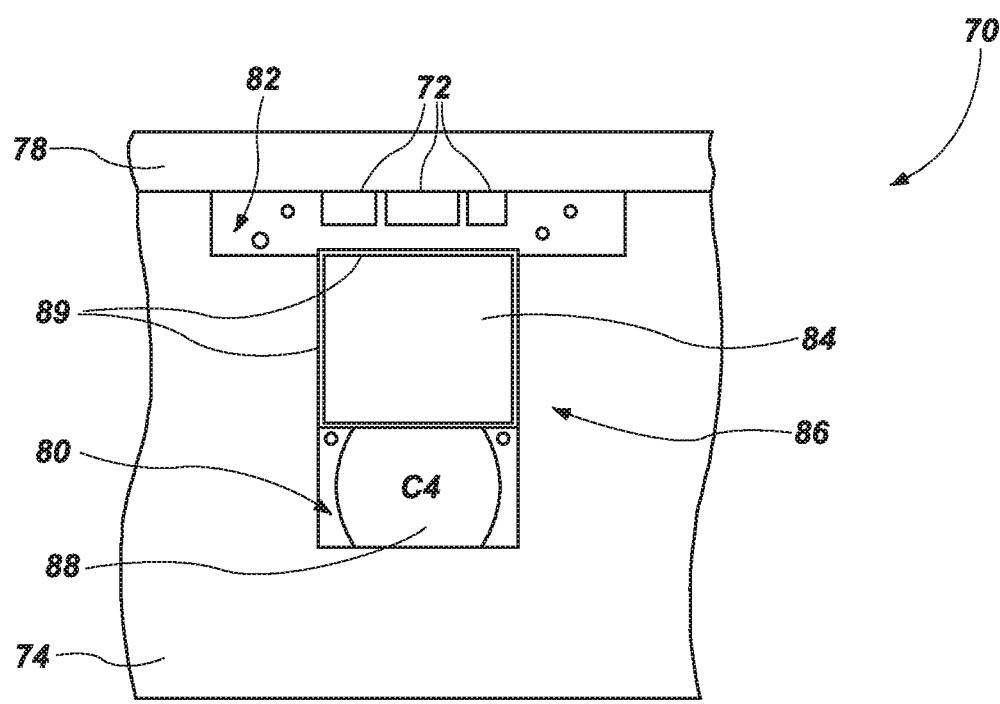
FIG. 4 is a cross-sectional view of a system for transferring heat from an electrical component to a heatsink, in accordance with an example of the present invention.

FIG. 4 illustrates a cross-sectional view of a system 70 for thermally coupling one or more (in this case three) electrical components 72 to a heatsink 74, in accordance with an example. The system 70 can comprise the electrical components 72 as part of an electronics assembly 78 (e.g., FIG. 3). It is contemplated that a single heat transfer device can be caused to thermally couple to a plurality of electrical components in accordance with any of the examples discussed herein, as exemplified in FIG. 4. The electrical components 72 can be positioned near the heatsink 74 and can be operative to transfer heat from the electronics assembly 78. The heatsink 74 can have a counterbore 80 defining a cavity 82 and operative to receive a piston 84 and to facilitate its movement therein. The system 70 can comprise a heat transfer device 86 positionable in the counterbore 80. As compared to the device of FIG. 1A, this system 70 and heat transfer device 86 is devoid of a cup. While FIG. 4 only shows an example heat transfer device 86 in a compressed state C4, it will be appreciated that it can function similar to the example heat transfer devices and methods discussed above in relation to FIGS. 1-3, as well and others as contemplated herein. Here, a compliant device 88, such as an elastomeric material, can be positioned between the heatsink 74 and the piston 84. The compliant device 88 can be movable from a compressed state C4 to an expanded state (not shown) to facilitate movement of the piston 84. A flowable material 89 can be disposed about the piston 84 and/or the counterbore 80. The method of manufacture and operation of the example of FIG. 4 will not be discussed in great detail because the reflow processes and piston movements are similar to that of FIGS. 1-3 and others. The primary difference here is that the FIG. 4 device is devoid of a cup. However, it will continue to be appreciated that, when the piston 84 is directly secured to the heatsink 74 via the flowable material 89 in its solid state, an all-metal heat transfer path can be created from the electrical components 72 through the piston 84 and to the heatsink 74.

Figure 5:
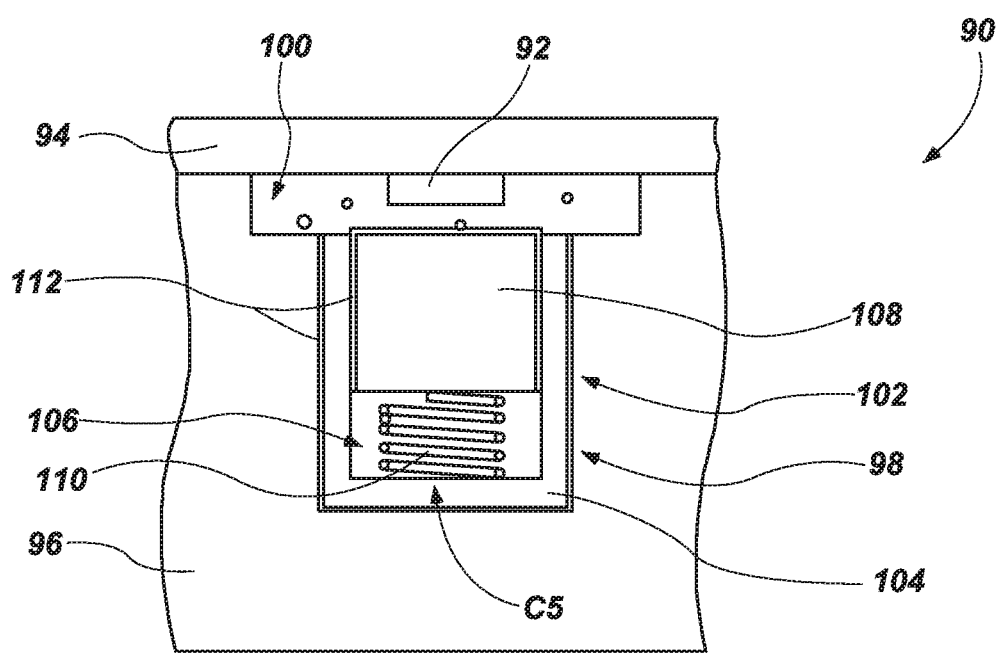
FIG. 5 is a cross-sectional view of a system for transferring heat from an electrical component to a heatsink, in accordance with an example of the present invention.

FIG. 5 illustrates a cross-sectional view of a system 90 for thermally coupling an electrical component to a heatsink, according to one example. The system 90 can comprise an electrical component 92 as part of an electronics assembly 94 (e.g., FIG. 3). The electrical component 92 can be positioned near a heatsink 96 and operative to transfer heat from the electronics assembly 94. The heatsink 96 can have a counterbore 98 defining a cavity 100. It should be appreciated that the counterbore 98 and the cavity 100 would typically be formed in the heatsink as a single counterbore defining a space in the heatsink. The system can comprise a heat transfer device 102 positionable in the counterbore 98. The heat transfer device 102 can comprise a cup 104 disposed within the counterbore 98 of the heatsink 96. The cup 104 can define a cavity 106. The heat transfer device 102 can comprise a piston 108 moveable within the cavity 106 of the cup 104. In this example, a compliant device 110 can comprise a coil spring positioned between the cup 104 and the piston 108 (similar to FIG. 1A). The coil spring 110 can be movable from a compressed state C5 (FIG. 5) to an expanded state (not shown) to facilitate movement of the piston 108 during reflow. A flowable material 112 can be disposed about the piston 108, the cup 104, and/or the counterbore 98. The method of manufacture and operation of the example of FIG. 5 will not be discussed in great detail as these are similar to that of FIGS. 1-3 and others. The primary difference here is that the FIG. 5 device includes at least one coil spring as the compliant device 110.

Figure 6A:
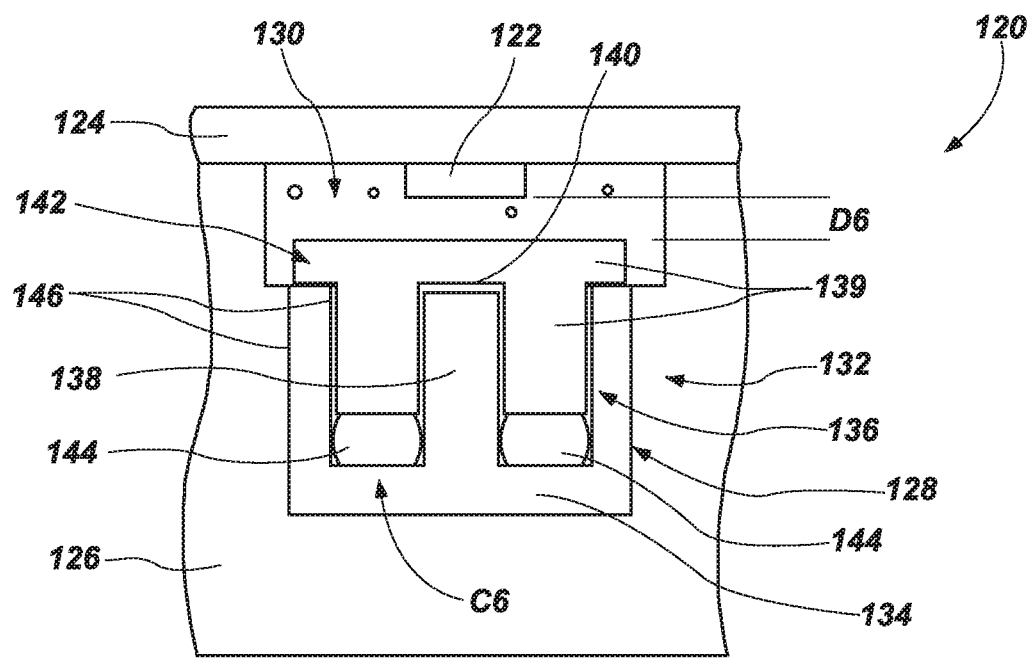
FIG. 6A is a cross-sectional view of a system for transferring heat from an electrical component to a heatsink, in accordance with an example of the present invention.
Figure 6B:
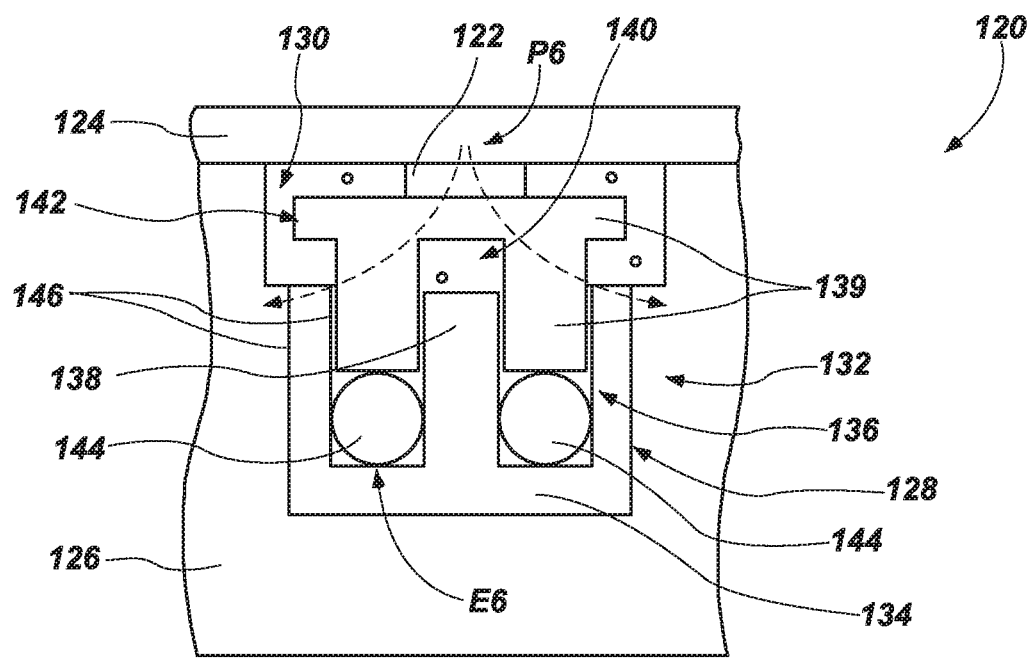
FIG. 6B is a cross-sectional view of the system of FIG. 6A in an expanded state, in accordance with an example of the present invention.

FIGS. 6A and 6B show cross-sectional views of a system 120 for thermally coupling an electrical component to a heatsink, according to another example. The system 120 can comprise an electrical component 122 as part of an electronics assembly 124 (e.g., FIG. 3). The electrical component 122 can be positioned near a heatsink 126 and operative to transfer heat from the electrical component 122. The heatsink 126 can have a counterbore 128 defining a cavity 130. The system can comprise a heat transfer device 132 positionable in the counterbore 128. The heat transfer device 132 can comprise a guide cup 134 disposed within the counterbore 128 of the heatsink 126. The guide cup 134 can define a cavity 136 and can comprise a post 138 extending from a center area of the guide cup 134. A piston 139 can comprise a hole 140 extending partially therethrough from a first surface towards a second surface along a central or longitudinal axis of the piston 139. The hole 140 can be sized and configured to receive therein the post 138 of the guide cup 134, such that the piston 139 can translate bi-directionally about the post 138. The piston 139 can further comprise an upper flanged portion 142 that is positionable against the electrical component 122. A compliant device 144 can comprise a hole through its central axis (e.g., the compliant device 144 can comprise an elastomer O-ring) and can be positioned between the piston 139 and the cup 134, such that the post of the cup 134 extends through the hole of the compliant device 144. In other words, the compliant device 144 can be disposed within the cup 134 and can be circumferentially located about the post 138. The compliant device 144 and the piston 138 can be collectively received on the post 138 for movement or expansion about the post 138.

Similar to the description with reference to FIGS. 1-3 and others, the compliant device 144 is placed in a compressed state C6 (FIG. 6A) then a flowable material 146 is reflowed, thereby securing the piston 139 in a first position (FIG. 6A). With the electrical component 122 in position adjacent the piston 139 (with a tolerance distance D6), the flowable material can be reflowed. Upon reflowing the flowable material, the compliant device 144 is allowed to release its potential energy to an expanded state E6, thereby displacing the piston 139 against the electrical component 122. Once the flowable material 146 is allowed to cool to its solid state, the piston 139 can be secured to the guide cup 134 (and its post 138) and the electrical component 122, which can create an all-metal thermally conductive path P6 (dashed lines). The inclusion of the guide post 138 in this example provides an additional surface area (i.e., the circumference area of the post) to transfer heat along an additional path via the piston 139, among other benefits.

Figure 7:
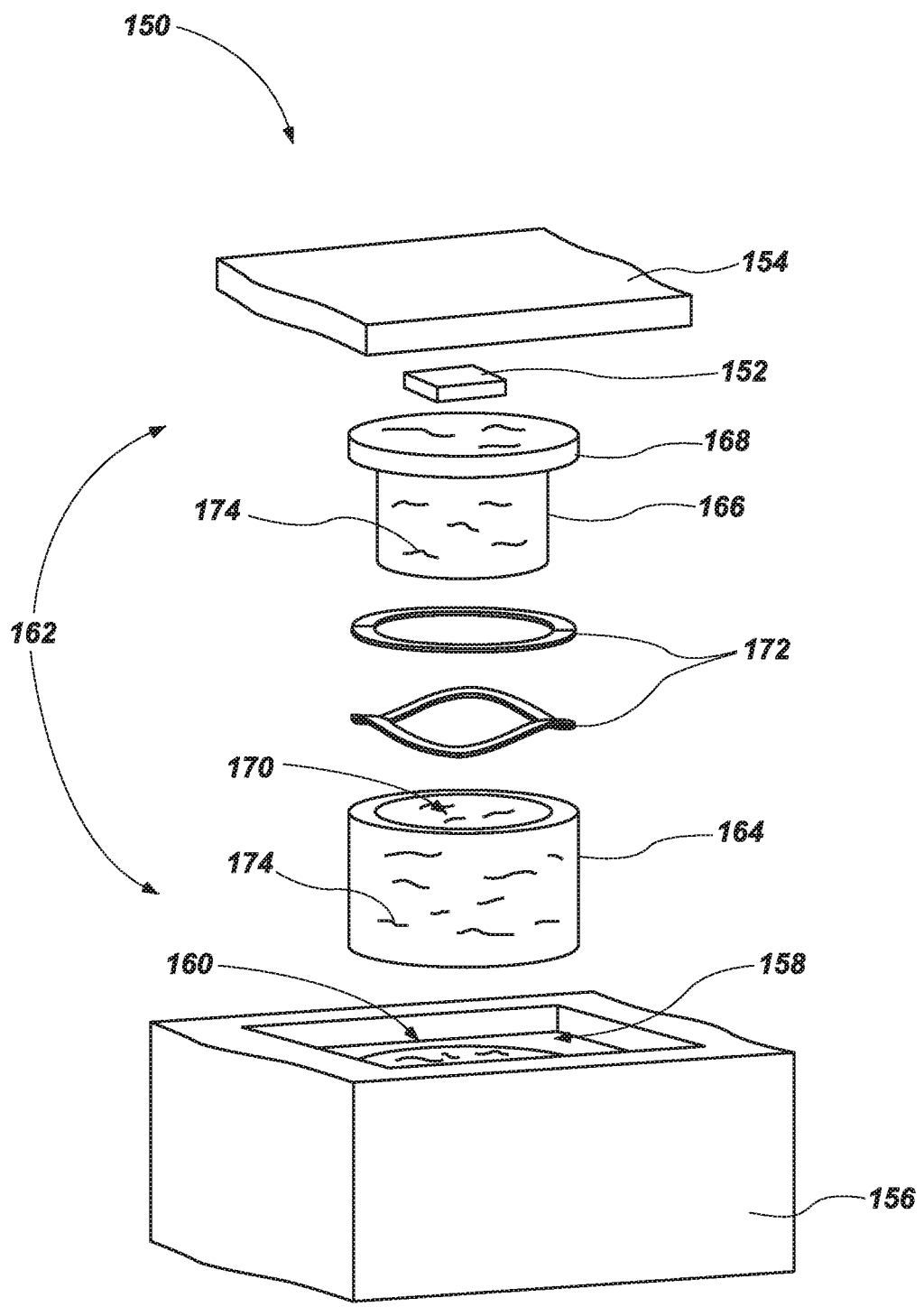
FIG. 7 is an exploded view of a system for transferring heat from an electrical component to a heatsink, in accordance with an example of the present invention.

FIG. 7 shows an exploded view of a system 150 according to still another example. The system 150 can comprise an electrical component 152 as part of an electronics assembly 154 (e.g., FIG. 3). The electrical component 152 can be positioned near a heatsink 156 and operative to transfer heat from the electronics assembly 154. The heatsink 156 can have a counterbore 158 defining a cavity 160. The system can comprise a heat transfer device 162 positionable in the counterbore 158. The heat transfer device 162 can comprise a cup 164 disposed within the counterbore 158 of the heatsink 156. The heat transfer device 162 can comprise a piston 166 having a flanged portion 168 around an end of the piston 166. The cup 164 can define a cavity 170 and can be operative to receive a portion of the piston 166 and to facilitate its movement therein. A compliant device 172 can be positioned between an upper area of the cup 164 and a lower area of the flanged portion 168 of the piston 166. The compliant device 172 can comprise a ring spring device comprising a pair of rings, and one or both rings can be configured to store potential energy upon a given force (much like a coil spring). The compliant device 172 can be movable from a compressed state to an expanded state to facilitate movement of the piston 166 during reflowing of the flowable material.

A flowable material 174, such as solder, can be disposed about the piston 166 and/or the cup 164. The flowable material 174 has a lower melting point than the piston 166 and the heatsink 156. The flowable material 174 is capable of transitioning between a solid and liquid state upon the application of energy, such as heat. Similar to the description of FIGS. 1-3, the piston 166 can be held in a first position by the flowable material 174 being in the solid state with the compliant device 172 in the compressed state. The flowable material 174 can be reflowed by the application of heat, for example, sufficient to melt the flowable material 174. Upon reflowing of the flowable material 174, the piston 166 can be moveable into a second position by expansion of the compliant device 172, such that the piston 166 is caused to be in thermal contact with the electrical component 152 upon reflowing the flowable material 174.

It is to be understood that the examples of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular examples only, and is not intended to be limiting.

Various examples of the present invention can be referred to herein along with alternatives for the various components thereof. It is understood that such examples and alternatives are not to be construed as de facto equivalents of one another, but are to be considered as separate and autonomous representations of the present invention.

Furthermore, the described features, structures, or characteristics can be combined in any suitable manner in one or more examples. In the description, numerous specific details are provided, such as examples of lengths, widths, shapes, etc., to provide a thorough understanding of examples discussed. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An electronics assembly comprising:
   a substrate;
   at least one electrical component supported by the substrate;

a heatsink being operative to transfer heat from the at least one electrical component, the heatsink comprising a counterbore defining a cavity, wherein at least a portion of the at least one electrical component is positioned within the cavity of the counterbore;

an expandable heat transfer device positioned within the counterbore of the heatsink, the expandable heat transfer device comprising:
a cup disposed within the counterbore of the heatsink, the cup defining a cup cavity;
a piston positioned within the cup cavity of the cup and in thermal contact with the at least one electrical component;
a flowable material disposed about the piston, the flowable material having a lower melting point than the piston and the heatsink, the flowable material being operable to transition between a solid state and a liquid state upon the application of energy; and
a compliant device positioned in the cup cavity of the cup and operable to bias the piston against the at least one electrical component, the compliant device movable from a compressed state to an expanded state to facilitate movement of the piston, wherein the piston is held in a first position by the flowable material being in the solid state with the compliant device in the compressed state, and wherein the piston is moveable to a second position toward the at least one electrical component to be in thermal contact with the electrical component upon reflowing the flowable material in the liquid state and the compliant device extending to its expanded state, such that the piston transfers heat from the at least one electrical component to the heatsink.

2. The system of claim 1, wherein the at least one electrical component extends into a portion of the cup cavity, such that a surface of the substrate is biased against the heatsink for transferring thermal energy.

3. The system of claim 1, wherein the piston is biased to the at least one electrical component within an area defined by the cup cavity of the cup.

4. The system of claim 1, wherein the piston, the heatsink, and the flowable material are each comprised of a type of metal, wherein an all-metal thermal conductive path is created between the at least one electrical component and the heatsink through the heat transfer device.

5. The system of claim 1, wherein the compliant device comprises an elastomeric material or a coil spring.

6. The system of claim 1, wherein the flowable material is disposed so as to maintain an all-metal thermal conductive path between the at least one electrical component and the heatsink.

7. The system of claim 1, wherein the compliant device comprises a spring positioned to bias the piston toward the at least one electrical component.

8. An assembly comprising a plurality of expandable heat transfer devices, including the expandable heat transfer device of claim 1, each heat transfer device of the plurality of expandable heat transfer devices being positionable in a respective cup cavity of a plurality of cup cavities of a plurality of cups positioned within a plurality of counterbores, respectively, formed in the heatsink.

9. A method for effecting heat transfer within an electronics assembly, the method comprising:
providing a substrate as part of the electronics assembly, the electronics assembly having at least one electrical component supported by the substrate;
providing a heatsink operative with the electronics assembly to transfer heat from the electronics assembly;
forming a counterbore in the heatsink defining a cavity;
positioning a cup of a heat transfer device within the counterbore of the heatsink, the cup defining a cup cavity, wherein the substrate supporting the at least one electrical component is biased against the heatsink, such that at least a portion of the at least one electrical component is positioned within the cavity of the counterbore;
positioning a compliant device and a piston of the heat transfer device within the cup cavity of the cup, the piston being operable to be in thermal contact with the at least one electrical component;
providing a flowable material to be in contact with the piston and the heatsink;
applying a force to displace the piston and cause the compliant device to enter a compressed state;
flowing the flowable material in a first sequence to secure the piston in a first position with the compliant device in the compressed state; and
reflowing the flowable material in a second sequence to secure the piston in a second position, and to cause the piston to be in thermal contact with the at least one electrical component, the compliant member biasing the piston into the second position.

10. The method of claim 9, wherein the reflowing the flowable material in a second sequence further comprises heating the flowable material to a liquid state for an amount of time sufficient to cause the compliant device to expand and displace the piston.

11. The method of claim 9, wherein the electronics assembly comprises a plurality of electrical components supported by the substrate, including the at least one electrical component, and wherein the method further comprises providing a plurality of heat transfer devices, including the heat transfer device, to create a plurality of separate heat transfer points along the heatsink from the plurality of electrical components.

12. The method of claim 11, further comprising configuring the plurality of heat transfer devices to operate independent of one another, such that the plurality of heat transfer devices make thermal contact with the plurality of electrical components, respectively, on the electronics assembly irrespective of differing tolerances between the electrical components and the heatsink.

* * * * *